US009653171B2

(12) United States Patent
Abraham et al.

(10) Patent No.: US 9,653,171 B2
(45) Date of Patent: May 16, 2017

(54) PARTIAL PAGE MEMORY OPERATIONS

(71) Applicant: Micron Technology, Inc., Boise, ID (US)

(72) Inventors: Michael Abraham, Ada, ID (US); Tomoharu Tanaka, Kanagawa (JP); Koichi Kawai, Kanagawa (JP); Yuichi Einaga, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/131,719

(22) Filed: Apr. 18, 2016

(65) Prior Publication Data

US 2016/0232979 A1    Aug. 11, 2016

Related U.S. Application Data

(63) Continuation of application No. 13/661,321, filed on Oct. 26, 2012, now Pat. No. 9,318,199.

(51) Int. Cl.
*G11C 16/10* (2006.01)
*G06F 12/02* (2006.01)
(Continued)

(52) U.S. Cl.
CPC ........ *G11C 16/107* (2013.01); *G06F 12/0246* (2013.01); *G11C 16/0483* (2013.01);
(Continued)

(58) Field of Classification Search
CPC ......... G06F 12/0246; G06F 2212/7201; G11C 16/107; G11C 16/0483; G11C 16/14
See application file for complete search history.

(56) References Cited

U.S. PATENT DOCUMENTS

| 5,615,152 | A | 3/1997 | Bergemont |
|---|---|---|---|
| 5,835,396 | A | 11/1998 | Zhang |

(Continued)

FOREIGN PATENT DOCUMENTS

| CN | 104903964 A | 9/2015 |
|---|---|---|
| EP | 2912665 A1 | 9/2015 |

(Continued)

OTHER PUBLICATIONS

"U.S. Appl. No. 13/564,458, Non Final Office Action mailed Feb. 26, 2016", 6 pgs.

(Continued)

*Primary Examiner* — Eric S Cardwell
(74) *Attorney, Agent, or Firm* — Schwegman Lundberg & Woessner, P.A.

(57) ABSTRACT

Apparatuses may include a memory block with strings of memory cells formed in a plurality of tiers. The apparatus may further comprise access lines and data lines shared by the strings, with the access lines coupled to the memory cells corresponding to a respective tier of the plurality of tiers. The memory cells corresponding to at least a portion of the respective tier may comprise a respective page of a plurality of pages. Subsets of the data lines may be mapped into a respective partial page of a plurality of partial pages of the respective page. Each partial page may be independently selectable from other partial pages. Additional apparatuses and methods are disclosed.

20 Claims, 10 Drawing Sheets

(51) Int. Cl.
*G11C 16/14* (2006.01)
*G11C 16/04* (2006.01)

(52) U.S. Cl.
CPC ............... *G11C 16/10* (2013.01); *G11C 16/14* (2013.01); *G06F 2212/7201* (2013.01)

(56) References Cited

U.S. PATENT DOCUMENTS

| | | | |
|---|---|---|---|
| 5,969,990 | A | 10/1999 | Arase |
| 6,154,391 | A | 11/2000 | Takeuchi et al. |
| 6,272,044 | B2 | 8/2001 | Yamamoto et al. |
| 6,307,781 | B1 | 10/2001 | Shum |
| 6,870,769 | B1 | 3/2005 | Ha |
| 7,023,739 | B2 | 4/2006 | Chen et al. |
| 7,196,930 | B2 | 3/2007 | Han et al. |
| 7,259,991 | B2 | 8/2007 | Aritome |
| 7,433,231 | B2 | 10/2008 | Aritome |
| 7,433,233 | B2 | 10/2008 | Chen et al. |
| 7,440,321 | B2 | 10/2008 | Aritome |
| 7,599,228 | B1 | 10/2009 | Lu et al. |
| 7,626,866 | B2 | 12/2009 | Aritome et al. |
| 7,940,564 | B2 | 5/2011 | Park et al. |
| 8,004,885 | B2 | 8/2011 | Yun et al. |
| 8,213,235 | B2 | 7/2012 | Kim |
| 8,237,213 | B2 | 8/2012 | Liu |
| 8,542,533 | B2 | 9/2013 | Maejima et al. |
| 8,599,614 | B2 | 12/2013 | Miida et al. |
| 8,797,806 | B2 | 8/2014 | Goda et al. |
| 9,318,199 | B2 | 4/2016 | Abraham et al. |
| 9,378,839 | B2 | 6/2016 | Goda et al. |
| 2007/0252201 | A1 | 11/2007 | Kito et al. |
| 2008/0219053 | A1 | 9/2008 | Kim |
| 2010/0172179 | A1 | 7/2010 | Gorobets |
| 2010/0257308 | A1* | 10/2010 | Hsu ............... G06F 12/0246 711/103 |
| 2010/0322000 | A1 | 12/2010 | Shim et al. |
| 2011/0049607 | A1 | 3/2011 | Yahashi |
| 2011/0051512 | A1 | 3/2011 | Violette |
| 2011/0141788 | A1 | 6/2011 | Balakrishnan et al. |
| 2011/0299314 | A1 | 12/2011 | Samachisa et al. |
| 2012/0081957 | A1 | 4/2012 | Kim et al. |
| 2012/0320678 | A1 | 12/2012 | Maejima et al. |
| 2013/0044549 | A1 | 2/2013 | Goda |
| 2013/0272067 | A1 | 10/2013 | Lee et al. |
| 2014/0036590 | A1 | 2/2014 | Feeley et al. |
| 2014/0122773 | A1 | 5/2014 | Abraham et al. |
| 2014/0340963 | A1 | 11/2014 | Goda et al. |

FOREIGN PATENT DOCUMENTS

| | | |
|---|---|---|
| KR | 1020110132820 A | 12/2011 |
| WO | WO-2007005891 A2 | 1/2007 |
| WO | WO-2011019794 A2 | 2/2011 |
| WO | WO-2014066829 A1 | 5/2014 |

OTHER PUBLICATIONS

"U.S. Appl. No. 13/564,458, Notice of Allowance mailed Oct. 2, 2015", 9 pgs.
"U.S. Appl. No. 13/564,458, Response filed May 4, 2015 to Restriction Requirement mailed Mar. 4, 2015", 10 pgs.
"U.S. Appl. No. 13/564,458, Response filed May 26, 2016 to Non Final Office Action mailed Feb. 26, 2016", 8 pgs.
"U.S. Appl. No. 13/564,458, Restriction Requirement mailed Mar. 4, 2015", 6 pgs.
"U.S. Appl. No. 14/451,145, Non Final Office Action mailed Oct. 1, 2015", 10 pgs.
"U.S. Appl. No. 14/451,145, Notice of Allowance mailed Feb. 29, 2016", 8 pgs.
"U.S. Appl. No. 14/451,145, Response filed Dec. 30, 2015 to Non Final Office Action mailed Oct. 1, 2015", 9 pgs.
"European Application Serial No. 13848265.8,Preliminary Amendment filed Dec. 16, 2015", 4 pgs.
"International Application Serial No. PCT/US2013/066931, International Preliminary Report on Patentability mailed May 7, 2015", 9 pgs.
"International Application Serial No. PCT/US2013/066931, International Search Report mailed Feb. 10, 2014", 3 pgs.
"International Application Serial No. PCT/US2013/066931, Written Opinion mailed Feb. 10, 2014", 7 pgs.
Jang, J., et al., "Vertical cell array using TCAT(Terabit Cell Array Transistor) technology for ultra high density NAND flash memory", Symposium on VLSI Technology, (2009), 192-193.
U.S. Appl. No. 15/166,029, filed May 26, 2016, Apparatus and Methods Including Source Gates.
"European Application Serial No. 1.3848265.8, Extended European Search Report maied Jun. 1, 2016", 7 pgs.

* cited by examiner

PARTIAL PAGE MEMORY OPERATIONS

PRIORITY APPLICATION

This application is a continuation of U.S. application Ser. No. 13/661,321, filed Oct. 26, 2012, which is incorporated herein by reference in its entirety.

CROSS-REFERENCE TO RELATED APPLICATIONS

This application may be related to U.S. patent application Ser. No. 13/210,194, entitled "APPARATUS AND METHODS INCLUDING SOURCE GATES," filed on Aug. 15, 2011. This application may also be related to U.S. patent application Ser. No. 13/564,458, entitled "PARTIAL BLOCK MEMORY OPERATIONS," filed on Aug. 1, 2012.

BACKGROUND

A memory block of a memory device, such as a NOT AND (NAND) or NOT OR (NOR) memory, may comprise a group of strings of memory cells that share the same set of access lines. The memory block may be grouped into a plurality of pages, and each page may comprise all or a subset of the memory cells corresponding to at least a portion of a respective tier of each of the group of strings, for example, depending on whether the memory cells are single-level cells (SLCs) or multi-level cells (MLCs).

Under existing semiconductor memory techniques, a memory operation may be performed on an entire memory block (e.g., if the memory operation is an erase), or on an entire (selected) page within the memory block (e.g., if the memory operation is a program, read or verify). Accordingly, as the page size becomes larger, the power used during a data line swing or page buffer flip may increase, so that a relatively large amount of power may be consumed when relatively small amounts of data, such as four (4) Kilo Bytes (KBs), are read, programmed, erased or verified. This tendency may be enhanced when an ABL (all-bit line) architecture is used, in comparison with a SBL (shielded bit line) architecture. Thus, as the size of the (single) memory block or page increases, as in the case of three-dimensional (3D) memory devices, so does the current consumption or parasitic current leakage when memory operations are performed, because the number of memory cells in the memory block or page on which the memory operations are performed concurrently also increases. This may result in the need to supply the memory device with additional or alternative power sources to support the extensive current consumption or parasitic leakage.

In addition, a host that operably communicates with a memory device formed according to existing technologies, for example, via a memory controller, may process data in a smaller unit than a page size of the memory device. Thus, conventional memory devices may require all of the page data to be filled in a page buffer before programming.

For example, when the memory device comprises a NAND memory, the host may process data in four (4) Kilo Bytes (KBs) units while the page size of the NAND memory is sixteen (16) KBs. In this case, the host may transmit or receive data to or from the memory controller controlling the NAND memory in four (4) KB s units via a page buffer while the memory controller transmits or receives the data to or from the NAND memory in sixteen (16) KBs units. Thus, the memory controller may need to wait and pack the data received from the host until the total size of the (received) data becomes sixteen (16) KBs before programming it to the NAND memory. If some portions of the relevant page are not filled, then the unfilled portions cannot be programmed at a later time without first having to erase the entire block to remove all of the data programmed in the block. This may result in undesired performance, such as a slower programming speed and a higher current consumption or parasitic current leakage, as described above, and so on.

DETAILED DESCRIPTION

The description that follows includes illustrative apparatuses (circuitry, devices, structures, systems, and the like) and methods (e.g., processes, protocols, sequences, techniques, and technologies) that embody the inventive subject matter. In the following description, for purposes of explanation, numerous specific details are set forth in order to provide an understanding of various embodiments of the inventive subject matter. It will be evident, however, to those of ordinary skill in the art, that various embodiments of the inventive subject matter may be practiced without these specific details. Further, well-known apparatuses and methods have not been shown in detail so as not to obscure the description of various embodiments.

As used herein, the term "or" may be construed in an inclusive or exclusive sense. Additionally, although various embodiments discussed below may primarily focus on multi-level cell memory devices, the embodiments are merely given for clarity of disclosure, and thus, are not limited to apparatuses in the particular form of NAND or NOR memory devices or even to memory devices in general. As an introduction to the subject, a few embodiments will be described briefly and generally in the following paragraphs, and then a more detailed description, with reference to the figures, will ensue.

To solve some of the problems described above, as well as others, various embodiments described herein propose splitting (e.g., breaking, dividing, etc.) each page in the memory block into a plurality of partial pages thereof. A partial page in a single page may be selected (e.g., controlled) independently from other partial pages to perform a memory operation on the memory cells corresponding to the selected partial page, while refraining from performing the memory operation on the memory cells corresponding to non-selected partial pages.

In various embodiments, for example, an apparatus described herein may comprise a memory block that includes a plurality of strings of memory cells, with access lines and data lines shared by the strings. Each of the strings may comprise memory cells formed in a plurality of tiers.

Each of the access lines may be coupled to the memory cells corresponding to a respective tier of the plurality of tiers. The memory cells corresponding to at least a portion of the respective tier may comprise a respective page of a plurality of pages of the memory block.

The data lines may comprise a plurality of subsets of data lines. Each subset of data lines may be mapped into a respective partial page of a plurality of partial pages of the respective page. Each partial page may be independently selectable from other partial pages, for example, for performing a memory operation with respect to the memory cells thereof. More information regarding various embodiments that incorporate these mechanisms will now be described with respect to FIGS. 1-9.

Figure 1:
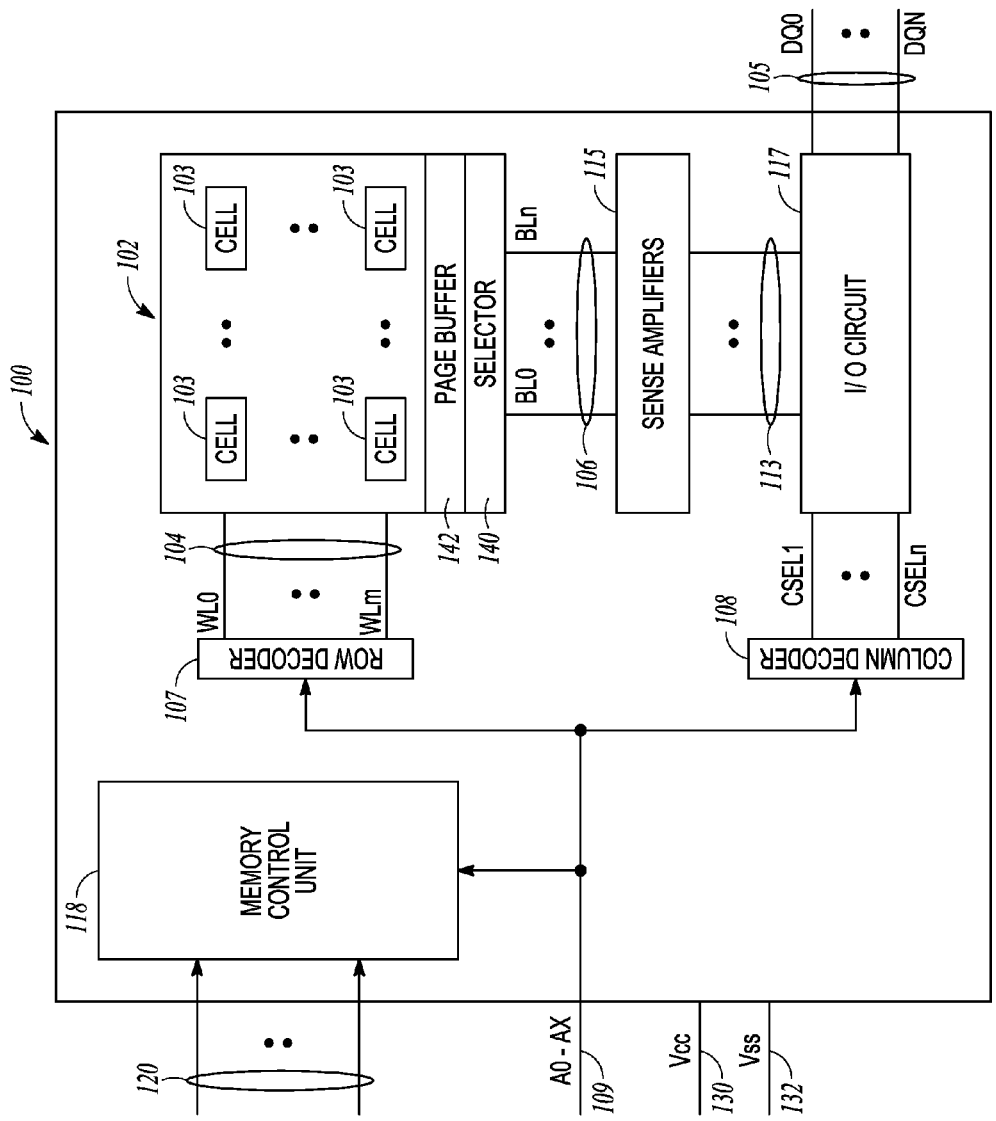
FIG. 1 shows a block diagram of a memory device having a memory array with memory cells, according to various embodiments.

FIG. 1 shows a block diagram of an apparatus in the form of a memory device 100. The memory device 100 includes a memory array 102 having a plurality of memory cells 103 according to an embodiment. The memory cells 103 can be arranged in rows and columns along with access lines 104 (e.g., word lines to conduct signals WL0 through WLm) and first data lines 106 (e.g., bit lines to conduct signals BL0 through BLn). The memory device 100 can use the access lines 104 and the first data lines 106 to transfer data to and from the memory cells 103. A row decoder 107 and a column decoder 108 decode address signals A0 through AX on address lines 109 to determine which ones of the memory cells 103 are to be accessed.

Sense circuitry, such as a sense amplifier circuit 115, operates to determine the values of data read from the memory cells 103 in the form of signals on the first data lines 106. The sense amplifier circuit 115 can also use the signals on the first data lines 106 to determine the values of data to be written to the memory cells 103.

The memory device 100 is further shown to include circuitry, such as an input/output (I/O) circuit 117, to transfer values of data between the memory array 102 and I/O lines 105. Signals DQ0 through DQN on the I/O lines 105 can represent values of data read from or to be written into the memory cells 103. The I/O lines 105 can include nodes within the memory device 100 (or alternatively, pins, solder balls, or other interconnect technologies such as controlled collapse chip connection (C4), or flip chip attach (FCA)) on a package where the memory device 100 resides. Other devices external to the memory device 100 (e.g., a memory controller or a processor, not shown in FIG. 1) can communicate with the memory device 100 through the I/O lines 105, the address lines 109, or the control lines 120.

The memory device 100 can perform memory operations, such as a read operation, to read values of data from selected ones of the memory cells 103 and a programming operation (also referred to as a write operation) to program (e.g., to write) data into selected ones of the memory cells 103. The memory device 100 can also perform a memory erase operation to clear data from some or all of the memory cells 103.

A memory control unit 118 controls memory operations to be performed on the memory cells 103 based on signals on the electrical state of signals on the control lines 120. Examples of the signals on the control lines 120 can include one or more clock signals and other signals to indicate which operation (e.g., a programming or read operation) the memory device 100 can or should perform. Other devices external to the memory device 100 (e.g., a processor or an external memory controller) can control the values of the control signals on the control lines 120. Specific combinations of values of the signals on the control lines 120 can produce a command (e.g., a programming or read command) that can cause the memory device 100 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 103 can be programmed to a different one of at least two data states to represent, for example, a value of a fractional bit, the value of a single bit or the value of multiple bits such as two, three, four, or more numbers of bits.

For example, each of the memory cells 103 can be programmed to one of two data states to represent a binary value of "0" or "1" in a single bit. Such a cell is sometimes called a single-level cell (SLC).

In another example, each of the memory cells 103 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail below.

The memory device 100 can receive a supply voltage, including supply voltage signals Vcc and Vss, on a first supply line 130 and a second supply line 132, respectively. Supply voltage signal Vss may, for example, be at a ground potential (e.g., having a value of approximately zero volts). Supply voltage signal Vcc can include an external voltage supplied to the memory device 100 from an external power source such as a battery or alternating-current to direct-current (AC-DC) converter circuitry (not shown in FIG. 1).

The memory device 100 is further shown to include a selector (e.g., a select circuit) 140, a page buffer 142, and an input/output (I/O) circuit 117. The selector 140 can respond, via the I/O circuit 117, to signals CSEL1 through CSELn to select signals on the first data lines 106 and the second data lines 113 that can represent the values of data to be read from or to be programmed into the memory cells 103. The column decoder 108 can selectively activate the CSEL1 through CSELn signals based on the A0 through AX address signals on the address lines 109. The selector 140 can select the signals on the first data lines 106 and the second data lines 113 to provide communication between the memory array 102 and the I/O circuit 117 during read and programming operations. The page buffer 142 may store data received from an external device, such as a host, before it is programmed into a relevant portion (e.g., the memory cells 103)

of the memory array 102, or store data read from the memory array 102 before it is transmitted to the external device (e.g., the host).

The memory device 100 may comprise a non-volatile memory device and the memory cells 103 can include non-volatile memory cells such that the memory cells 103 can retain data stored therein when power (e.g., Vcc 130, Vss 132, or both) is disconnected from the memory device 100.

Each of the memory cells 103 can include a memory element having material, at least a portion of which can be programmed to a desired data state (e.g., by storing a corresponding amount of charge on a charge storage structure, such as a floating gate or charge trap, or by being programmed to a corresponding resistance value). Different data states can thus represent different values of data programmed into each of the memory cells 103.

The memory device 100 can perform a programming operation when it receives (e.g., from an external processor or a memory controller) a programming command and a value of data to be programmed into one or more selected ones of the memory cells 103. Based on the value of the data, the memory device 100 can program the selected memory cells to appropriate data states to represent the values of the data to be stored therein.

One of ordinary skill in the art may recognize that the memory device 100 may include other components, at least some of which are discussed herein. However, several of these components are not necessarily shown in the figure, so as not to obscure the various embodiments described. The memory device 100 may include devices and memory cells, and operate using memory operations (e.g., programming and erase operations) similar to or identical to those described below with reference to various other figures and embodiments discussed herein.

Figure 2:
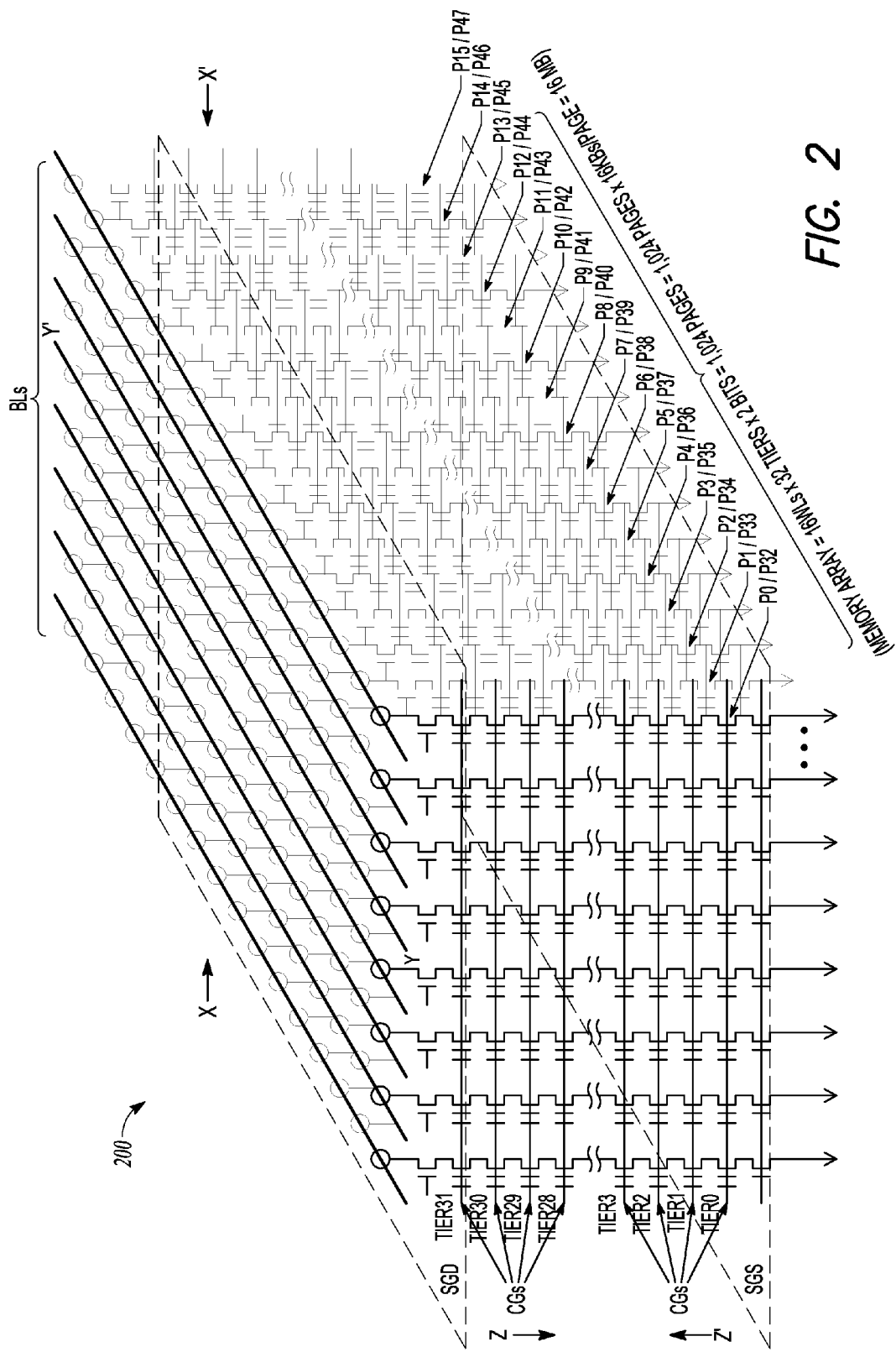
FIG. 2 shows a schematic diagram of the memory array of FIG. 1 in the form of a 3D NAND memory device, according to various embodiments.

FIG. 2 shows a block diagram of a memory array (e.g., the memory array 102) in the form of a 3D NAND memory device 200, according to various embodiments. Referring to FIG. 2, the 3D NAND memory device 200 may comprise a plurality of strings of memory cells. In various embodiments, in a first (e.g., Z-Z') direction, each string of memory cells may comprise, for example, thirty two memory cells stacked over one another with each memory cell corresponding to one of, for example, thirty two tiers (e.g., Tier0-Tier31). The memory cells of a respective string may share a common channel region, such as one formed in a respective pillar of semiconductor material (e.g., polysilicon) about which the string of memory cells are formed.

In various embodiments, in a second (e.g., X-X') direction, each first group of, for example, sixteen first groups of the plurality of strings may comprise, for example, eight strings sharing a plurality (e.g., thirty two) of access lines (WLs). Each of the plurality of access lines (hereinafter used interchangeably with "global control gate (CG) lines") may couple (e.g., electrically or otherwise operably connect) the memory cells corresponding to a respective tier of the plurality of tiers of each string of a corresponding one of the first groups. The memory cells coupled to the same access line (and thus corresponding to the same tier) may be logically grouped into, for example, two pages, such as P0/P32, P1/P33, P2/P34 and so on, when each memory cell comprise an MLC capable of storing two bits of data.

In various embodiments, in a third (e.g., Y-Y') direction, each second group of, for example, eight second groups of the plurality of strings may comprise, for example, sixteen strings coupled to a corresponding one of eight data lines (BLs). In one embodiment, due to a CG driver layout limitation, for example, the CGs of the (e.g., sixteen) memory cells corresponding to a respective tier of the (e.g., sixteen) strings of each second group of strings may be physically coupled as a respective plate, as indicated by an upper (dotted) rectangle in FIG. 2. Similarly, source select gates (SGSs) of the (e.g., sixteen) strings of each second group of strings may be physically coupled as a respective plate, as indicated by a bottom (dotted) rectangle in FIG. 2. In such a scenario, for example, the size of the memory array of the 3D NAND memory device 200 may include, for example, sixteen memory blocks, and may comprise 1,024 pages and total about 16 MB (e.g., 16 WLs×32 Tiers×2 bits=1,024 pages/block, block size=1,024 pages×16 KB/page=16 MB). Although specific numbers are used for explanation and clarity, as is known to a person of ordinary skill in the art, the number of the strings, tiers, access lines, data lines, first groups, second groups or pages may be greater or smaller than those shown in FIG. 2. It is also noted that each string of memory cells schematically shown in FIG. 2 may represent a plurality of strings in the second (e.g., X-X') or third (e.g., Y-Y') direction in various embodiments.

Figure 3:
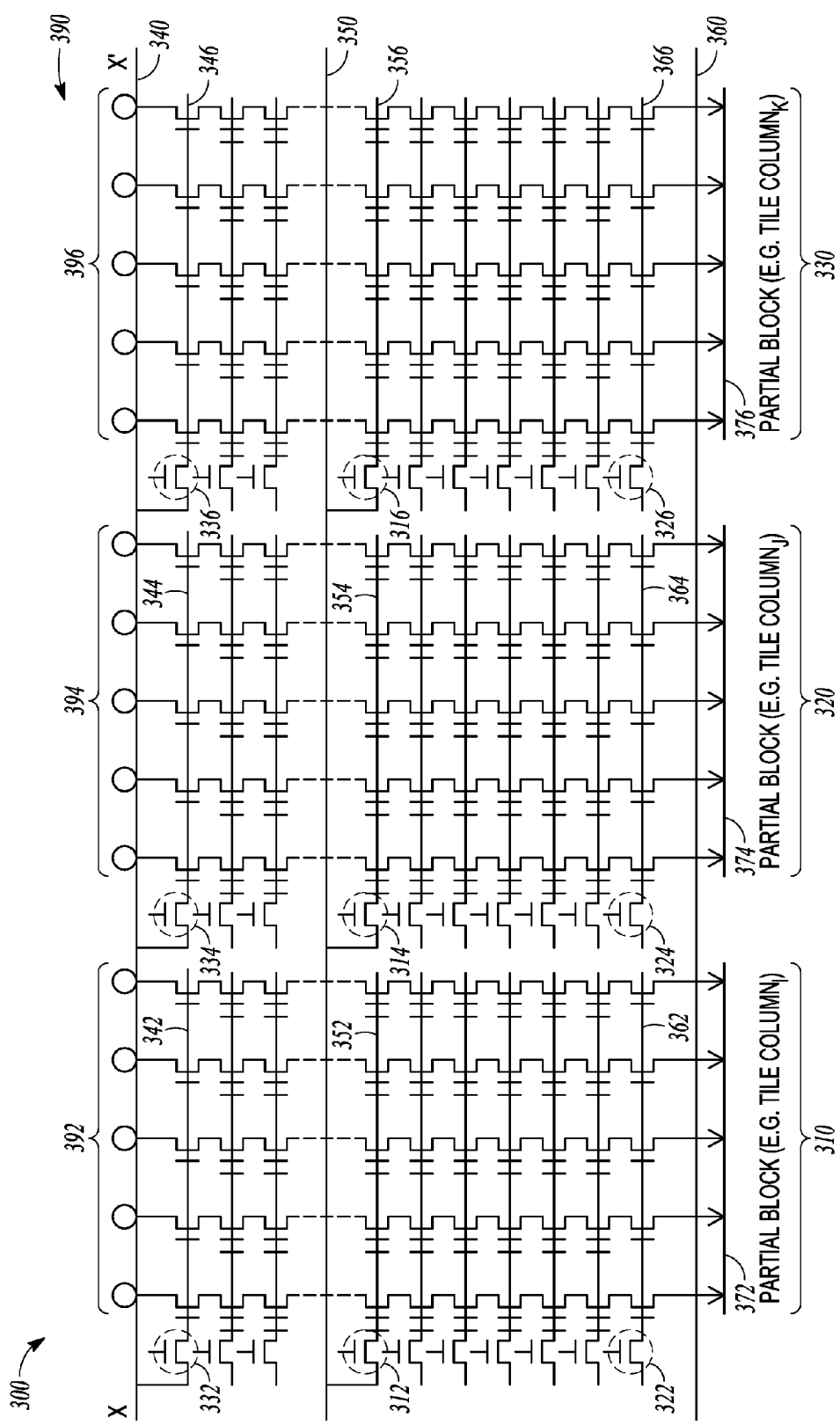
FIG. 3 shows a cross sectional view of the 3D NAND memory device of FIG. 2 in an X-X' direction, according to various embodiments.

FIG. 3 shows a cross sectional view of a (selected) memory block 300 of the 3D NAND memory device 200 of FIG. 2 in an X-X' direction, but in this embodiment including fifteen strings of memory cells in one of the, for example, sixteen first groups of strings described with respect to FIG. 2. The plurality of strings of the memory block 300 may be split into a plurality (e.g., three) of "subsets" 310, 320, 330, with each subset comprising a "partial block" of the memory block 300. The memory cells corresponding to a respective tier of the plurality of (e.g., thirty-two (32)) tiers may comprise (at least) a page (e.g., page 390). Each page (e.g., the page 390) may comprise a plurality (e.g., three) of partial pages (e.g., partial pages 392-396), with each partial page comprising the memory cells corresponding to a respective one of the plurality of partial blocks and corresponding to the respective tier of the plurality of tiers.

In various embodiments, each partial page (e.g., the partial page 392, 394 or 396) may comprise a tile, and be independently selectable (e.g., biased) from other partial pages (e.g., tiles). In such a case, for example, each of the partial blocks 310-330 may comprise a tile column, such as tile column$_i$, tile column$_j$ and tile column$_k$, with each tile column comprising a collection (e.g., set) of tiles corresponding to the plurality of tiers (e.g., Tier0-Tier31). In various embodiments, a memory (e.g., program, read, read or verify) operation may be performed on a partial block (e.g., tile column) or a partial page (e.g., single tile). It is noted that although FIG. 3 is shown to have only three partial blocks (and three partial pages in a given page) in the memory block 300, a greater (e.g., sixteen (16) or more) or smaller (e.g., one (1) or two (2)) number of partial blocks (and partial pages in the given page) may be employed in various embodiments.

In various embodiments, (although not shown in FIG. 3) each memory block (e.g., the memory block 300), partial block (e.g., the partial block 310, 320 or 330), page (e.g., the page 390), or partial page (e.g., the partial page 392, 394 or 396), may comprise (at least a portion of) a plurality of strings of memory cells in the direction of the third (e.g., Y-Y') direction.

In various embodiments, the memory block 300 (or any other memory block in the 3D NAND memory device 200) may be electrically split into a plurality of smaller units, including the partial pages.

For example, in one embodiment, a global drain select gate (SGD) line 340 that may be coupled to the SGDs of the plurality of strings may be coupled to a plurality (e.g., three) of local SGD lines 342, 344, 346 with each local SGD line corresponding to a respective partial block (e.g., tile column), via a corresponding one of a plurality (e.g., three) of local SGD drivers 332, 334, 336. Each of the local SGD drivers 332-336 may concurrently couple or cut off the SGDs of the strings of a corresponding partial block (e.g., tile column) independently of those of other partial blocks, for example, when the corresponding partial block should be isolated from the other partial blocks.

Similarly, a global SGS line 360 that may be coupled to the SGSs of the plurality of strings may be coupled to a plurality (e.g., three) of local SGS lines 362, 364, 366 with each local SGS line corresponding to the respective subset (e.g., tile column), via a corresponding one of a plurality (e.g., three) of local SGS drivers 322, 324, 326. Each of the local SGS drivers 322-326 may concurrently couple or cut off the SGSs of the strings of a corresponding partial block (e.g., tile column) independently of those of other partial blocks, for example, to electrically isolate the corresponding partial block from other partial blocks.

In various embodiments, as shown in FIG. 3, for a respective tier of the plurality of tiers of the strings of the memory block 300, a global access line (e.g., a global CG line 350 may be coupled to the memory cells corresponding to the respective tier of each of the plurality of strings. Each global CG line (e.g., the global CG line 350) may be coupled to a plurality (e.g., three) of local access lines (e.g., local CG lines) 352, 354, 356 via a corresponding one of a plurality (e.g., three) of local string drivers 312, 314 and 316. Each of the local string drivers may concurrently couple or cut off the memory cells corresponding to the respective partial block or tier independently of those of other partial blocks and/or other tiers, for example, to isolate the corresponding partial block and/or tier from other partial blocks and/or tiers.

In various embodiments, each of the local string drivers 312-316 may comprise a voltage transistor to support a voltage range, for example, up to about 20V, and its channel length may be about 2 μm, while that of a memory cell (e.g., a charge storage device) may be about 20 nm. In various embodiments, the local string drivers 312-316 may be located in row decoders, and the row decoders may be placed under a memory array (e.g., the memory array 102) using, for example, CUA technology. This allows reducing the area needed for the circuits.

In various embodiments, the strings corresponding to the respective partial block may be coupled to a corresponding one of local sources 372, 374 and 376 (e.g., "tile source") with each local source being coupled to a respective power source, such as a local source driver (not shown). In various embodiments, a partial block source decoder (e.g., tile column source decoder) and/or a partial block drain decoder (e.g., tile column drain decoder) may be used to receive a column address (e.g., an address for a string) from, for example, an external processor, and to select a local source (e.g., tile source), a local SGS line, and/or a local SGD line of a partial block using the column address. Each of the local source drivers may concurrently couple or cut off the sources of the strings of a corresponding partial block independently of those of other partial blocks when the corresponding partial block should be isolated from the other partial blocks.

Figure 4:
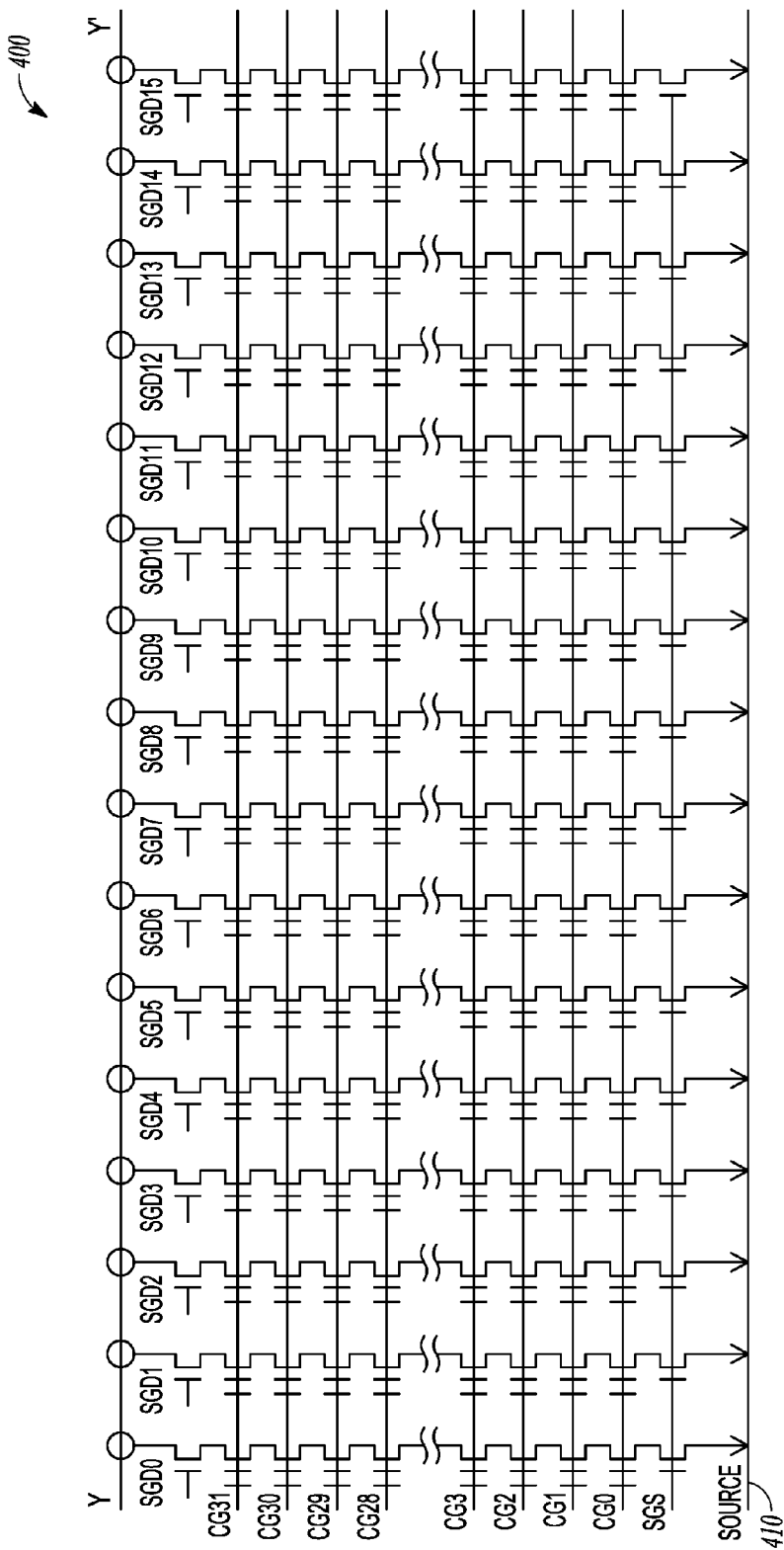
FIG. 4 shows a cross sectional view of the 3D NAND memory device of FIG. 2 in a Y-Y' direction, according to various embodiments.

FIG. 4 shows a cross sectional view of a memory block 400 of the 3D NAND memory device 200 of FIG. 2 in a Y-Y' direction, according to various embodiments. Referring to FIG. 4, the depicted memory block cross-section 400 may comprise a plurality (e.g., sixteen) of strings of memory cells that are coupled to the same data line (shown as the line YY'), and correspond to one of the, for example, eight second groups of strings described with respect to FIG. 2. As noted with respect to FIG. 2, in various embodiments, each memory cell of a respective tier may be coupled to the same plate (e.g., one of plates CG0-CG31). Similarly, the (e.g., sixteen) SGSs of the plurality strings may be coupled to a same SGS plate. In various embodiments, each of the SGDs (e.g., SGD0-SGD15) of the plurality of strings may be separated from one another. In various embodiments, the plurality of strings may be coupled to a (shared) source 410.

Figure 5:
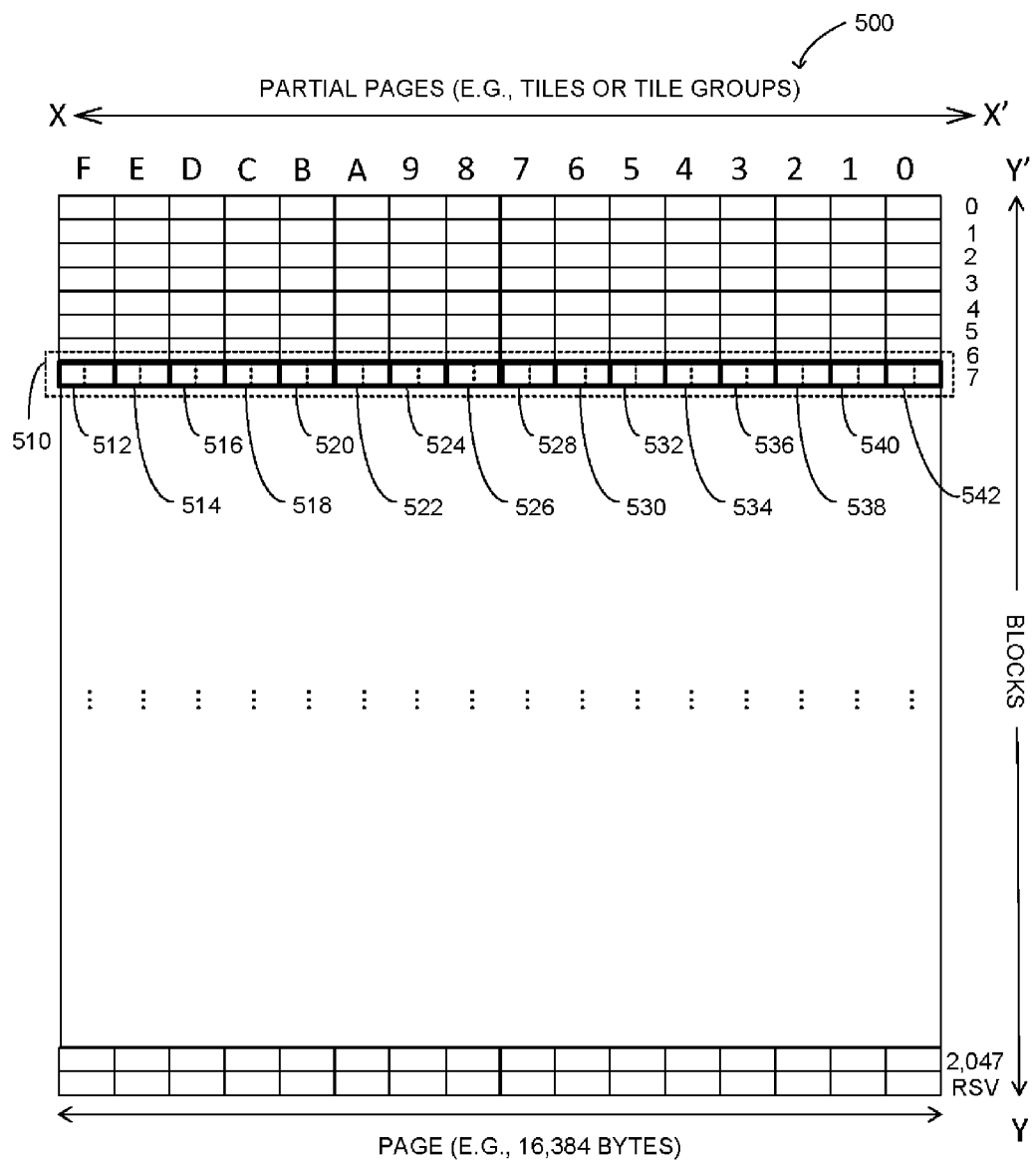
FIG. 5 shows a top view of the 3D NAND memory device of FIG. 2, according to various embodiments.

FIG. 5 shows a top view 500 of the 3D NAND memory device 200 of FIG. 2, but in this embodiment including 2,049 blocks (e.g., each corresponding to a memory block such as the memory block 300), including block0-block2, 047 and a reserved block "RSV," and each page (e.g., page 510) including sixteen partial pages (e.g., partial pages 512-542). Each page may comprise memory cells corresponding to about 16,384 bytes (e.g., about 16 KBs), for example. As described above, for example, with respect to FIG. 3, each partial page may correspond to a (single) tile, and each tile may be independently selectable from other tiles for a memory operation.

In various embodiments, a plurality of (e.g., two or four) tiles may be combined to form a tile group. The tile group structure may be used to perform a memory operation on portions of a memory block (e.g., the memory block 300) for example, by selecting some tile groups for the memory operation and refraining from performing the memory operation on other tile groups within the memory block or a page therein. In such a scenario, a memory array may be implemented (e.g., designed) such that each page (e.g., the page 510) may comprise a plurality of partial pages, such as partial pages 512-542 (represented by larger rectangles each enclosing two smaller rectangles separated by a dotted vertical line) in FIG. 5, and each partial page may correspond to the tile group comprising a plurality of (e.g., two) tiles. Thus, for example, each page (e.g., the page 510) corresponding to one of the blocks (e.g., the block0-block2, 047 or the block "RSV") and corresponding to a given tier of the plurality of (e.g., thirty-two (32)) tiers, may comprise sixteen (16) tile groups, with total thirty-two (32) tiles, as indicated by dotted lines in FIG. 5, depending on design choices.

Figure 6:
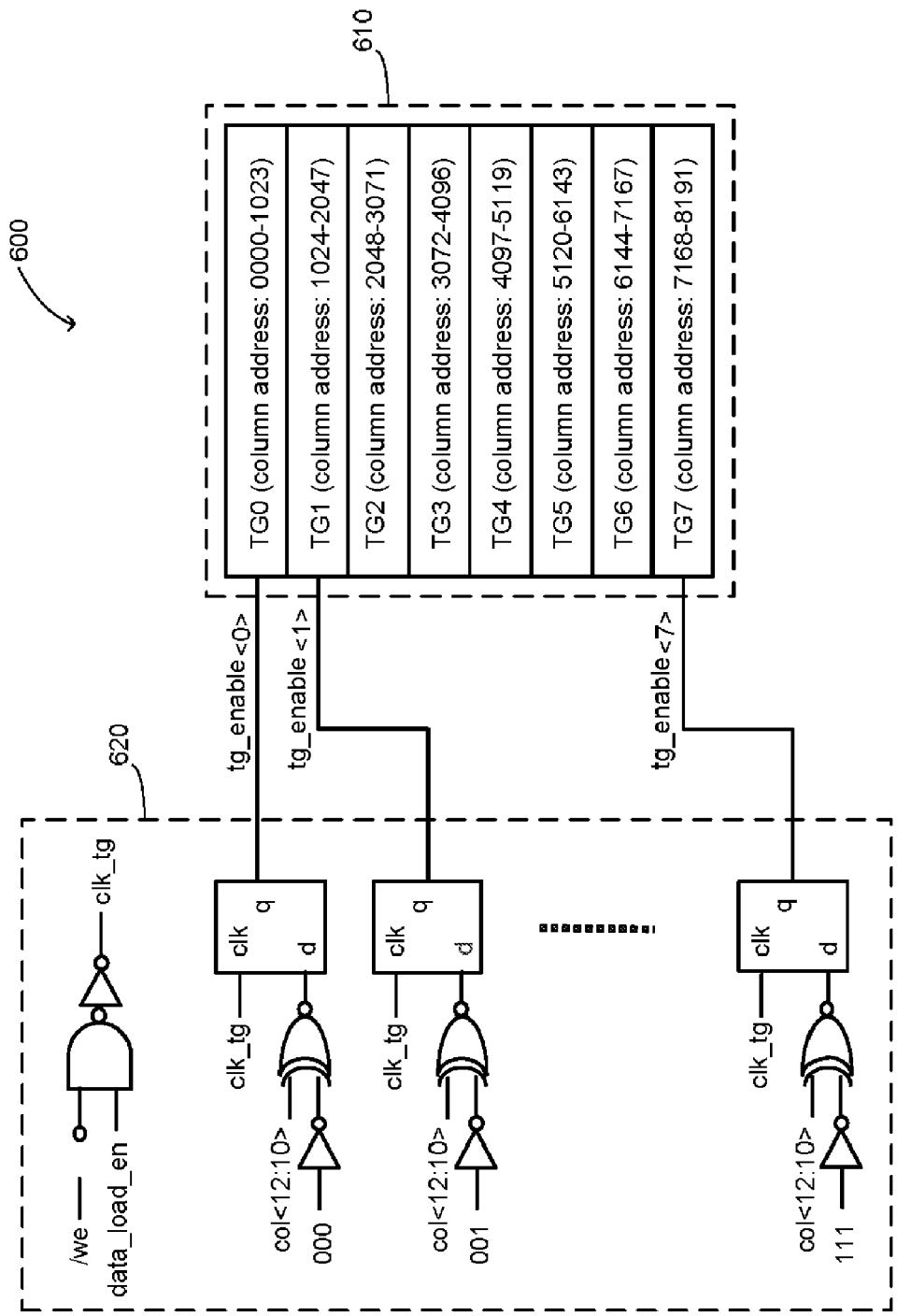
FIG. 6 shows an example circuit for mapping between column addresses and partial pages in the form of tile groups, according to various embodiments.

FIG. 6 shows an example circuit 600 for mapping between partial pages (e.g., tile groups) and memory (e.g., column) addresses, according to various embodiments. For example, each of a plurality of tile groups, TG0-TG7 of a memory array 610 (e.g., the 3D NAND memory device 200) may be preassigned (e.g., premapped into) a specified range of column addresses. When a request for a memory (e.g., program) operation is received at a relevant memory controller (e.g., the memory control unit 118), a corresponding one or more of the tile groups, TG0-TG7, may be selected as a function of an enabling signal from a corresponding one or more of a plurality of selection/control circuits 620 (e.g., the row decoder 107, the column decoder 108, and/or the selector 140).

It is noted that although FIG. 6 is explained with respect to an embodiment where the column addresses of the memory array 610 may map into eight tile groups, TG0-TG7, other embodiments may be possible. For example, referring to FIG. 5, in the case of a memory array where each block (and each page thereof) is split into sixteen (16) tile groups (e.g., partial pages 512-542), then the entire column addresses of the memory array may map into sixteen (16) ranges.

In various embodiments, for example, (e.g., write) data associated with the memory (e.g., program) operation may be split into a plurality of portions based on the tile group size (e.g., boundary). Each of the plurality of portions of the data may be mapped into a corresponding one of the plurality of tile groups, TG0-TG7. As the mapping is done at least partially, the corresponding tile groups may be selected, sequentially or concurrently, to perform the memory operation with respect to a respective (mapped) portion of the data. Since each tile group is independently selectable from other tile groups, the memory operation on a respective tile group may be performed independently without affecting integrity of the data stored in other (non-selected) tile groups. The size of each tile of a memory device (e.g., the memory array 200) may be physically determined when the memory device is designed. Thus, capability of grouping a plurality (e.g., two, four or eight and so on) of tiles as a (single) tile group, and selecting each tile group independently from other tile groups allows the memory device flexibility to adapt to various (e.g., data transfer) specifications between the memory device and other devices (e.g., the memory control unit 118 or an external processor). Although FIG. 6 shows an example where the size of each tile group comprises about one (1) KB (e.g., 1,024 bytes), the circuit 600 may be used for mapping larger or smaller tile group sizes.

In various embodiments, the tile or tile group size may determine the smallest page granularity for a memory operation. The tile or tile group size may be determined based at least in part on a page size, a number of tile groups, a number of tiles in each tile group, a spare area size, and so on. If a (e.g., NAND) page size is about X bytes (for a regular page area) plus Y bytes (for a spare page area), then the tile group size may be about (X+Y)/(the number of tile groups in a page). For example, in the case of the value of X being about 16,384 bytes (e.g., about 16 KB), if the value of Y is about 2,208 bytes and the number of tile groups per page is sixteen (16), then the tile group size may be calculated to be about (16,384+2,208)/16=about 1,162 bytes. In such a case, the tile size may be calculated by dividing the tile group size by the number of tiles combined in each tile group. Thus, continuing on the above example, if two tiles are combined in each tile group, then the tile size may be about 1,162/2=about 581 bytes. In this example, since each tile group may be independently programmed, read, erased or verified of other tile groups, the (e.g., NAND) page may be programmed in up to sixteen (16) steps, as little as one tile group at a time. Programming of a tile group at each time may leave the data stored in other (e.g., non-selected or non-activated) tile groups unaffected.

Accordingly, under the 3D NAND memory according to various embodiments, since column addresses (e.g. byte locations) within a (e.g., an MLC) page are mapped into a plurality of tile groups corresponding to the page that are independently selectable from other tile groups, the number of times the page can be programmed may be more than one (1). This is not supported in the existing NAND memory designs because, for example, there are no tile or tile group structures in the existing memories. Pages of the existing NAND memory can be programmed only once, and programming portions of the page that are unprogrammed in a previous program operation currently requires erasing an entire memory block including the page.

In various embodiments, tile groups may be gathered (e.g., aggregated or combined together), for example, to adjust bandwidth per tile group. In such cases, the column address range may be split by the number of tile groups gathered together. Multiple examples of tile group gathering are provided below with respect to table 1. For these examples, it is assumed that there are sixteen (16) tile groups in a given page, and the page size is about N bytes (e.g. about 18,592 bytes, such as about 16 KB of page area plus about 2,208 bytes of spare area). It is also assumed that bandwidth per tile group is about =X MT/s (e.g. 400 MT/s).

TABLE 1

| | Examples of Tile Group Gathering | | | | |
|---|---|---|---|---|---|
| | One Tile Group Gather Per Page | Two Tile Group Gathers Per Page | Four Tile Group Gathers Per Page | Eight Tile Group Gathers Per Page | Sixteen Tile Group Gathers Per Page |
| No. of tile groups per tile group gather | 16 | 8 | 4 | 2 | 1 |
| No. of program operations per page (NOP) | 1 | 2 | 4 | 8 | 16 |
| Bandwidth per tile group | X/16 (e.g., 25 MT/s) | X/8 (e.g., 50 MT/s) | X/4 (e.g., 100 MT/s) | X/2 (e.g., 200 MT/s) | X/1 (e.g., 400 MT/s) |
| Address range for $Y^{th}$ tile group gather | 0 to N-1 (same as 2D NAND) | $1^{st}$-$2^{nd}$ ranges: $Y*N/2$ to $[(Y + 1)*N/2 - 1]$ (where $0 \le Y \le 1$) | $1^{st}$-$4^{th}$ ranges: $Y*N/4$ to $[(Y + 1)*N/4 - 1]$ (where $0 \le Y \le 3$) | $1^{st}$-$8^{th}$ ranges: $Y*N/8$ to $[(Y + 1)*N/8 - 1]$ (where $0 \le Y \le 7$) | $1^{st}$-$6^{th}$ ranges: $Y*N/16$ to $[(Y + 1)*N/16 - 1]$ (where $0 \le Y \le 15$) |

In various embodiments, one of the above-listed or other gathering configurations may be selected for implementation within a 3D NAND memory at a given time as a design preference. Such selection may be based at least in part on warranted tradeoffs between the bandwidth per tile group and the number of tile group gathers. As shown in Table 1, more tile group gathers per page (e.g. a less number of tile groups per tile group gather) may result in a higher access bandwidth per tile group. Increasing the access bandwidth per tile group may in turn increase internal data bus width, internal bus speed, increased die size, or increased power consumption or parasitic leakage.

Figure 7:
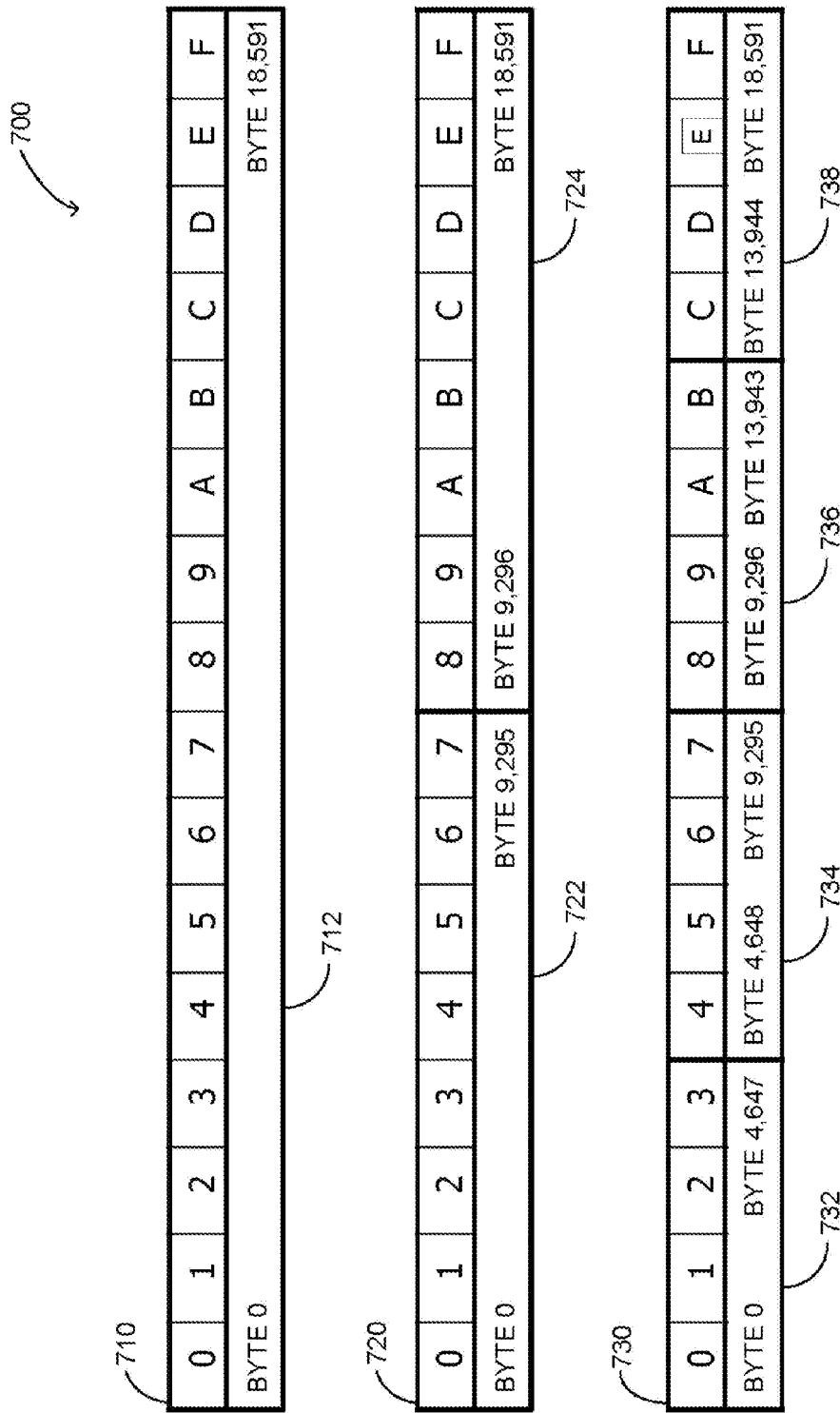
FIG. 7 shows example schemes for mapping between column addresses and partial pages in the form of a tile group gather, according to various embodiments.

FIG. 7 shows example schemes 700 for mapping between column addresses and partial pages in the form of a tile group gather, according to various embodiments. Data can be scrambled (e.g., accessed), such as being programmed, read from, erased from, or verified, across any tile groups in a given tile group gather, for example, to reduce the bandwidth used to access each tile group. Column address boundaries may be determined by the page size and the number of tile group gathers per page, for example, as described above with respect to Table 1. As shown in FIG. 7, for example, in the case of the page size being about 18,592 bytes, a first (e.g., top) mapping scheme 710 for one (1) tile group gather per page may have one (1) column address range 712 covering from byte 0 to byte 18,591. A second (e.g., middle) mapping scheme 720 for two (2) tile group gathers per page may have two (2) column address ranges 722, 724, with each covering from byte 0 to byte 9,295, and from byte 9,296 to byte 18,591, respectively. A third (e.g., bottom) mapping scheme 730 for four (4) tile group gathers per page may have four (4) column address ranges 732, 734, 736, 738, with each covering from byte 0 to byte 4,647, from byte 4,648 to byte 9,295, from byte 9,296 to byte 13,943, and from byte 13,944 to byte 18,591, respectively.

It is noted that although FIG. 7 shows each tile group gather comprises a plurality of tile groups each mapped into memory (e.g., column) addresses continuous (e.g., sequential) to those of other tile groups, other arrangements are possible. For example, the first (e.g., left) tile group gather in the second mapping scheme 720 may comprise tile groups "0," "2," "4," "6," "8," "A," "C," and "E," and the second (e.g., right) tile group gather in the second mapping scheme 720 may comprise tile groups "1," "3," "5," "7," "9," "B," "D," and "F." Also, when input (e.g., write) data (e.g., within a contiguous address range) is split (e.g., divided) into a plurality of data portions, or each data portion is mapped into a corresponding tile group gather, the data portions of the input data may be extend across all the tile groups in the (mapped) tile group gather. The tile groups within the (mapped) tile group gather may be selected sequentially or non-sequentially relative to their associated column addresses. In other embodiments, the selection of the tile groups within the (mapped) tile group gather may be determined based at least in part on non-address related aspects, such as frequency of usage of each tile group or any other specified rules.

In various embodiments, the data path speed may be considered in the data scramble arrangement. For example, mapping about 1,162 sequential bytes to one tile or one tile group may increase the amount of circuitry needed to maintain the faster data rate. Several tiles or tile groups may be grouped together, for example, based on locations within memory addresses instead of keeping them completely independent.

For programming, in various embodiments, information regarding which tiles or tile groups of a given 3D NAND memory have data to be written may be taken into consideration, and in some embodiments, only those tiles or tile groups may be programmed. In some embodiments, a host may be responsible for knowing which portions (e.g., partial pages) of a given page have been programmed, and which portions of the page have not been programmed. The 3D NAND memory may operate to report its partial page size (e.g., boundaries) for a program operation so that the host can send write data to the 3D NAND memory so as to align the write data to those boundaries.

In some embodiments, algorithms for the program operation may be adjusted as a rate of voltage applied for the program operation increasing or decreasing quickly or at a constant rate (e.g., a ramp rate) changes, for example, due to more or fewer tiles or tile groups being activated. This may result in changing the resistance or capacitance presented to drivers. This type of operation may avoid a change in the command set used to implement a program operation, for example.

In some embodiments, when reading a lower page having previously programmed portions, the 3D NAND memory may operate to check which tiles or tile groups have had the lower page portion already programmed, and may return only valid data for tiles or tile groups that have been previously programmed. When reading a lower page with some portion of an associated upper page being previously programmed, the 3D NAND memory may adjust its read algorithms for tiles or tile groups that do not have the upper page programmed. When reading an upper page, the 3D NAND memory may operate to monitor which tiles have had the upper page previously programmed and return valid data only for tiles or tile groups that have the upper page already programmed. A change in read algorithms may also be avoided when these types of operations are used, so that all tiles or tile groups may still be read, even though data is returned to the host only when valid, previously programmed tiles are read.

Considering now the various embodiments illustrated in FIGS. 1-7, and previously described, it can be seen that an apparatus may comprise a memory block, the memory block comprising: strings of memory cells, each string comprising memory cells formed in a plurality of tiers; access lines shared by the strings, each access line coupled to the memory cells corresponding to a respective tier of the plurality of tiers, the memory cells corresponding to at least a portion of the respective tier comprising a respective page of a plurality of pages; and data lines shared by the strings, the data lines comprising a plurality of subsets of data lines, each subset of data lines being mapped into a respective partial page of a plurality of partial pages of the respective page, each partial page independently selectable from other partial pages.

In various embodiments, each of the plurality of partial pages may comprise a tile.

In various embodiments, each of the plurality of partial pages may comprise a tile group. Each tile group may include a plurality of tiles.

In various embodiments, each of the plurality of partial pages may comprise a tile group gather. Each tile group gather may include a plurality of tile groups.

In various embodiments, the plurality of tile groups included in the tile group gather may be proximately related according to a numerical address sequence.

In various embodiments, at least one of the plurality of tile groups included in the tile group gather may be proximately unrelated according to a numerical address sequence.

In various embodiments, the apparatus may further comprise a control unit configured to map write data into the respective page of the respective tier of the plurality of tiers such that a first portion of the write data will be programmed into a first partial page of the partial pages, and a second portion of the write data will be programmed into a second partial page of the partial pages, upon receiving a command to write the write data at the control unit.

In various embodiments, the control unit may be configured to trigger programming the write data in the respective page prior to a page buffer (e.g., the page buffer 142 in FIG. 1) associated with the block being filled.

In various embodiments, the control unit may be configured to program the first portion of the write data into the first partial page, and to program the second portion of the write data into the second partial page. Programming of the second portion of the write data may comprise programming the second portion into the second partial page after programming the first portion into the first partial page and without first erasing the memory block.

In various embodiments, an apparatus may comprise a memory block, the memory block comprising: strings of memory cells, each string comprising memory cells formed in a plurality of tiers; access lines shared by the strings, each access line coupled to the memory cells corresponding to a respective tier of the plurality of tiers, the memory cells corresponding to the respective tier comprising a respective page of a plurality of pages; and data lines shared by the strings, the data lines comprising a plurality of subsets of data lines, each subset of data lines being mapped into a respective partial page of a plurality of partial pages of the respective page including a first partial page and a second partial page, each partial page independently selectable from other partial pages such that a single memory operation can be independently performed on the first partial page and the second partial page.

In various embodiments, the apparatus may further comprise a hardwired circuit (e.g., the circuit 600) or routing logic (e.g., logic embodied in the memory control unit 118) to implement the mapping between the subsets of data lines and the plurality of partial pages. When routing logic is used, the apparatus may further comprise a register to store the mapping information for use, for example, by the routing logic at a later time (e.g., when a request for the memory operation is received).

In various embodiments, the apparatus may further comprise a control unit configured to select at least one of the first partial page or the second partial page based on column addresses associated with data for the single memory operation. For example, in some embodiments, the at least one of the first or second partial page may be selected as a function of predefined mapping information (e.g., a relationship) between the subset of data lines and the plurality of partial pages based on the data being input to specific column addresses within the column (e.g., page) address range. In such a case, in one embodiment, a partial page may be selected by entering (e.g., by a host) data to one or more column address locations within the address range of that partial page. Similarly, multiple partial pages may be selected based on data being entered into one or more column address ranges corresponding to (e.g., premapped into) those (multiple) partial pages.

In various embodiments, the apparatus may further comprise a control unit to select, as the first and second partial pages, two partial pages that are proximately unrelated according to a numerical address sequence.

Figure 8:
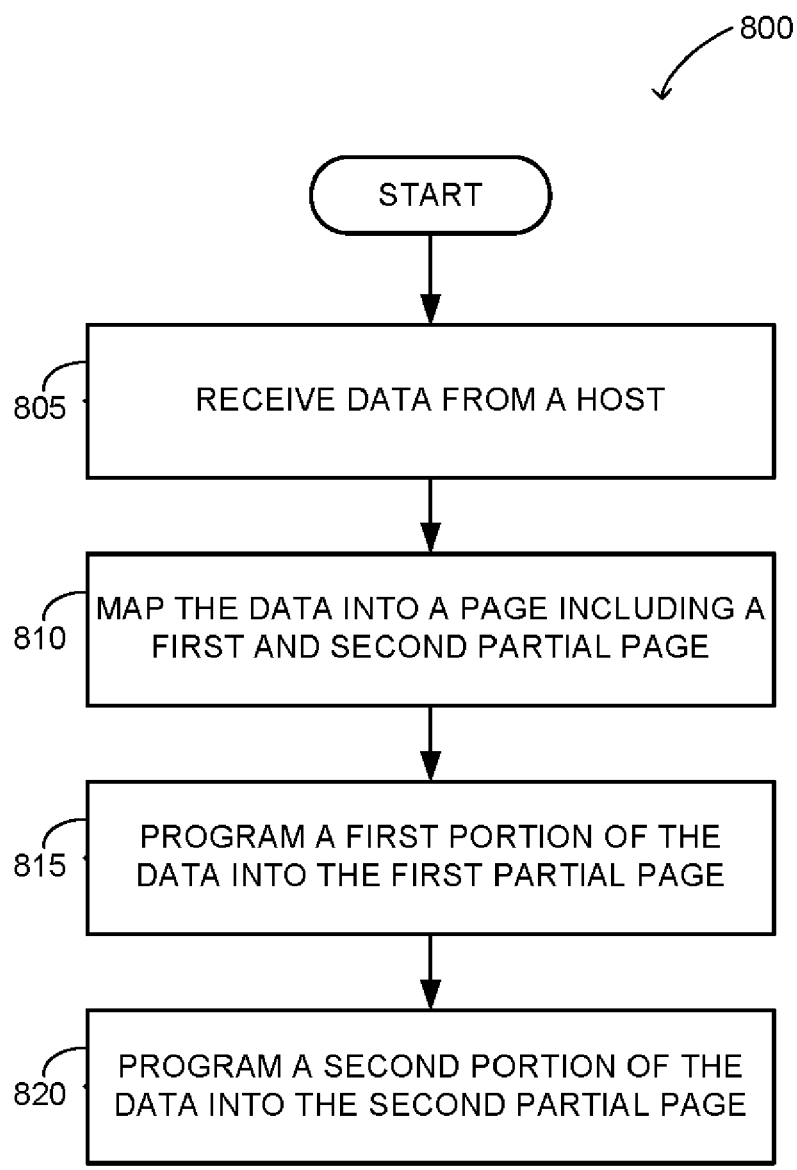
FIG. 8 shows a flow diagram illustrating methods of performing a program operation on a page, according to various embodiments.

FIG. 8 shows a flow diagram illustrating methods 800 of performing a program operation on a page, according to various embodiments. The methods 800 may be implemented using the apparatuses shown in FIGS. 1-6, among others. In various embodiments, the methods 800 may commence at block 805 with receiving data from a host (e.g., a computer or a user device operably communicating with a memory device including the memory block 300 in FIG. 2). At block 810, the (received) data may be mapped into a page (e.g., the page 390 in FIG.3) selected from a plurality of pages. Each of the plurality of pages may correspond to one of a plurality of (e.g., thirty-two (32)) tiers in a memory block (e.g., the memory block 300). The (selected) page may comprise a plurality of partial pages (e.g., the partial pages 392-396) including a first partial page (e.g., the partial page 394) and a second partial page (e.g., the partial page 392). Mapping of the (received) data into the (selected) page may comprise mapping a first portion of the data into the first partial page, and a second portion of the data into the second partial page. At block 815, the first portion of the data may be programmed into the first partial page. At block 820, the second portion of the data may be programmed into the second partial page independently of the first portion of the data programmed in the first partial page. In various embodiments, if it is determined that the (received) data is mapped into the memory (e.g., column) addresses corresponding to the entire page (e.g., the page 390), then all of the partial pages, including the first and second partial pages, of the page may be selected and programmed concurrently.

In various embodiments, receiving the data from the host may comprise initiating a page program including programming of the first partial page before a page buffer receiving the data is filled.

In various embodiments, mapping the data into the page may comprise splitting the data into the portions based at least in part on a size of the page and a number of the partial pages.

In various embodiments, mapping the data into the page may comprise selecting, as the first and second partial pages, two partial pages of the plurality of partial pages corresponding to the page, with the two partial pages being proximately related according to a numerical address sequence.

In various embodiments, mapping the data into the page may comprise selecting, as the first and second partial pages, two partial pages of the plurality of partial pages corresponding to the page, with the two partial pages being proximately unrelated according to a numerical address sequence. For example, in one embodiment, the (e.g., second) partial page that is closer to the end of the address range of the page may be selected first, and then the other (e.g., first) partial page that is closer to the start of the address range of the page (than the second partial page), and vice versa.

In various embodiments, programming the first portion of the data may comprise activating a first set of data lines corresponding to the first partial page, and disabling other data lines including a second set of data lines corresponding to the second partial page.

In various embodiments, programming the second portion of the data may comprise activating the second set of data lines, and disabling other data lines including the first set of data lines.

In various embodiments, programming the second portion of the data may comprise programming the second portion of the data without first erasing the selected page after programming the first portion of the data.

In various embodiments, programming the second portion of the data may comprise refraining from programming the first partial page.

In various embodiments, the methods 800 may further comprise mapping column addresses within the page into the plurality of partial pages corresponding to the page prior to receiving the data.

In various embodiments, the methods 800 may further comprise reporting, to the host, a mapping relationship between the column addresses within the page and the plurality of partial pages corresponding to the page.

Figure 9:
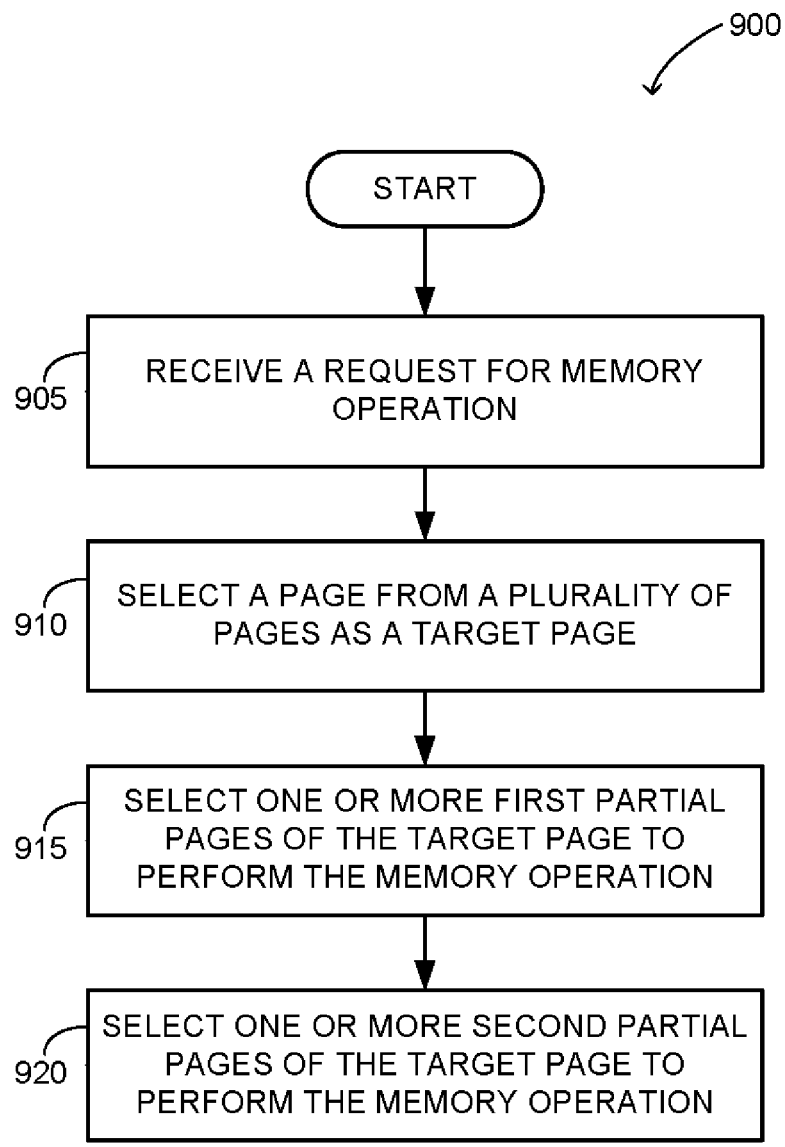
FIG. 9 shows a flow diagram illustrating methods of performing a memory operation on a page, according to various embodiments.

FIG. 9 shows a flow diagram illustrating methods 900 of performing a memory operation on a partial page, according to various embodiments. The methods 900 may be implemented using the apparatuses shown in FIGS. 1-6, such as those including a memory block (e.g., the memory block 300), with the memory block comprising a plurality of pages. Each page of the plurality of pages may correspond to one of a plurality of (e.g., thirty-two (32)) tiers, and each page (e.g., the page 390) may comprise a plurality of partial pages (e.g., the partial pages 392-396) including a first partial page (e.g., the partial page 394) and a second partial page (e.g., the partial page 392). In various embodiments, the methods 900 may commence at block 905 with receiving a request for a memory operation, for example, from a host operably coupled to a memory device including the memory block (e.g., the memory block 300). At block 910, a page may be selected from the plurality of pages as a target page (e.g., the page 390), At block 915, one or more partial pages, including the first partial page (e.g., the partial page 394), of the target page may be selected to perform the memory operation, At block 920, one or more additional partial pages, including the second partial page (e.g., the partial page 392), of the target page may be selected to perform the memory operation independently of the one or more partial pages, including the first partial page (e.g., the partial page 394), on which the memory operation has been performed previously.

Figure 10:
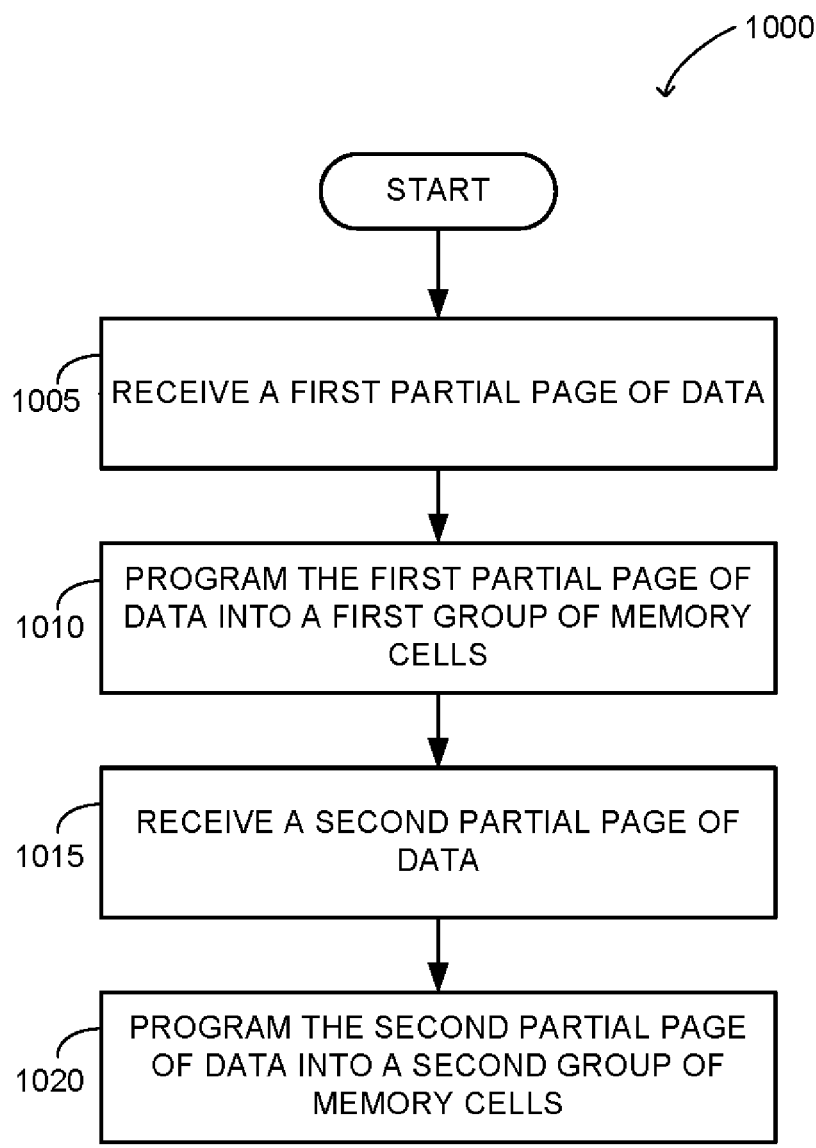
FIG. 10 shows a flow diagram illustrating methods of performing a memory operation on a page, according to various embodiments

FIG. 10 shows a flow diagram illustrating methods 1,000 of performing a program operation on a page, according to various embodiments. The methods 1,000 may be implemented using the apparatuses shown in FIGS. 1-6, among others. In various embodiments, the methods 1,000 may commence at block 1,005 with receiving, at a memory device (e.g., the 3D NAND memory device 200), a first partial page of data from a host (e.g., a computer or a user device operably communicating with the 3D NAND memory device 200). At block 1,010, the (received) first partial page of data may be programmed into a first group of memory cells of a selected page (e.g., the page 390 in FIG. 3) selected from a plurality of pages. At block 1,015, a second partial page of data may be received at the memory device after the first partial page of data is programmed into the first group of memory cells of the selected page. At block 1,020, the (received) second partial page of data may be programmed into a second group of memory cells of the selected page without first erasing the particular page or reprogramming the first partial page of data programmed into the first group of memory cells of the selected page.

In various embodiments, the first and second partial pages of data may be received at a same data rate. That is, a data rate may be maintained throughout transfer of a given data set between the host and the memory device.

In various embodiments, the host may track which partial pages of the selected page have already been programmed.

In various embodiments, the memory device may refrain from tracking which partial pages of the selected page have already been programmed In various embodiments, only those partial pages of the selected page that have data in them that need to be written, may be programmed. Partial pages of the selected page into which no data to be written is mapped, may be refrained from being programmed.

In various embodiments, a partial page programming size may be reported to the host, for example, from the memory device.

In various embodiments, a programming algorithm may be adjusted as ramp rates change, for example, during the programming of the first or the second partial pages of data.

In various embodiments, when reading a lower page of the selected page with only a portion of the lower page being programmed, read data may be returned only for partial pages that have been programmed.

In various embodiments, when reading a lower page of the selected page with only a portion of an upper page being programmed, a read algorithm may be adjusted for reading memory cells of the selected page that do not have their upper page programmed.

In various embodiments, when reading an upper page of the selected page, read data may be returned only for partial pages that have had their upper page programmed.

In various embodiments, all memory cells of the selected page may be read, and data may be returned to the host only for valid, programmed partial pages.

In various embodiments, each memory operation disclosed herein may comprise a program operation, a read operation, a verify operation, or an erase operation. Each of the plurality of partial pages may comprise at least one tile.

In summary, apparatuses and methods for partial page memory operations are disclosed herein. According to various embodiments disclosed herein, a partial page memory operation may be implemented within a NAND memory device that comprises multi-level cells storing more than one (1) bit per cell. Large NAND page sizes (e.g. 16 KB) may be supported with few (e.g., two (2)) planes. These operations can be implemented so that the NAND memory does not have to track which portion(s) of a page has (have) already been programmed, since the tracking of page usage may be monitored by a host. Programming operations may consume less power, for example, when programming a smaller portion (e.g., partial page, such as a tile, tile group or tile group gather) of a page. Similar mechanisms may be applied for a partial page read or verify, or a partial block erase, with some of commands being modified. Write amplification may thus be reduced, and system block management algorithms, such as a garbage collection, may be simplified.

The illustrations of the apparatus, methods and signals described with respect to FIGS. 1-10 are intended to provide a general understanding of the structures and functionalities of various embodiments, and not as a complete description of all the elements and features of apparatus, signals, or methods that might make use of the structures and functionalities described herein.

The novel apparatuses and methods of various embodiments may comprise and/or be included in electronic circuitry used in computers, communication and signal processing circuitry, single or multi-processor modules, single or multiple embedded processors, multi-core processors, data switches, and application-specific modules including multilayer, multi-chip modules. Such apparatuses and methods may further be included as sub-components within a variety of electronic systems, such as televisions, cellular telephones (e.g., smartphones), personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising:
 a plurality of strings of memory cells, the memory cells formed in a plurality of tiers, the strings of memory cells arrange in memory blocks, wherein a memory block among the memory block includes a first partial block and a second partial block, the first partial block including first memory cells in a first tier of the plurality of tiers, the second partial block including second memory cells in the first tier of the plurality of tiers;
 global access lines, each of the global access lines shared by memory cells in a respective tier of the plurality of tiers;
 a first local access line shared by the first memory cells, the first local access line coupled to a global access line of the global access lines through a first string driver; and
 a second local access line shared by the second memory cells, the second local access line coupled to the global access line through a second string driver.

2. The apparatus of claim 1, further comprising a global drain select line, wherein the first partial block includes first strings of memory cells of the plurality of strings of memory cells, the second partial block includes second strings of memory cells of the plurality of strings of memory cells, the first strings of memory cells share a first local drain select line, the second strings of memory cells share a second local drain select line, the first local drain select line is coupled to the global drain select line through a first select line driver, and the second local drain select line is coupled to the global drain select line through a second select line driver.

3. The apparatus of claim 1, further comprising a global source select line, wherein the first partial block includes first strings of memory cells of the plurality of strings of memory cells, the second partial block includes second strings of memory cells of the plurality of strings of memory cells, the first strings of memory cells share a first local source select line, the second strings of memory cells share a second local source select line, the first local source select line is coupled to the global source select line through a first select line driver, and the second local source select line is coupled to the global source select line through a second select line driver.

4. The apparatus of claim 1, further comprising a third local access line coupled to the global access line through a third second string driver, wherein the memory block includes a third partial block, the third partial block including third memory cells in the first tier of the plurality of tiers, and the third memory cells sharing the third local access line.

5. The apparatus of claim 1, wherein the first memory cells are configured to store first data, and the second memory cells are configured to store second data after the first data is stored.

6. The apparatus of claim 1, wherein the first data is included in a first partial page of a page, and the second data is included in a second partial page of the page.

7. The apparatus of claim 1, wherein the first memory cells are included in a first tile, the second memory cells are included in a second tile, and the first and second title are proximately related according to a numerical address sequence.

8. The apparatus of claim 1, wherein the first memory cells are included in a first tile, the second memory cells are included in a second tile, and the first and second title are proximately un related according to a numerical address sequence.

9. An apparatus comprising:
 a plurality of strings of memory cells, the memory cells formed in a plurality of tiers, the strings of memory cells arrange in memory blocks, wherein a memory block among the memory block includes a first partial block and a second partial block, the first partial block including first strings of memory cells of the plurality of strings of memory cells, the first strings of memory cells including first memory cells in a first tier of the plurality of tiers, the first memory cells mapped to a first partial page of a page, the second partial block including second strings of memory cells of the plurality of strings of memory cells, the second strings of memory cells including second memory cells in the first tier of the plurality of tiers, the second memory cells mapped to a second partial page of the page;
 first data lines coupled to the first strings of memory cells; and
 second data lines different from the first data lines, the second data lines coupled to the second strings of memory cells.

10. The apparatus of claim 9, further comprising:
 global access lines, each of the global access lines shared by memory cells in a respective tier of the plurality of tiers;
 a first local access lines shared by the first memory cells, the first local access line coupled to a global access line of the global access lines through a first string driver; and
 a second local access lines shared by the second memory cells, the second local access line coupled to the global access line through a second string driver.

11. The apparatus of claim 10, further comprising a global drain select line, wherein the first partial block includes first strings of memory cells of the plurality of strings of memory cells, the second partial block includes second strings of memory cells of the plurality of strings of memory cells, the first strings of memory cells share a first local drain select line, the second strings of memory cells share a second local drain select line, the first local drain select line is coupled to the global drain select line through a first select line driver, and the second local drain select line is coupled to the global drain select line through a second select line driver.

12. The apparatus of claim 11, further comprising a global source select line, wherein the first partial block includes first strings of memory cells of the plurality of strings of memory cells, the second partial block includes second strings of memory cells of the plurality of strings of memory cells, the first strings of memory cells share a first local source select line, the second strings of memory cells share a second local source select line, the first local source select line is coupled to the global source select line through a first select line driver, and the second local source select line is coupled to the global source select line through a second select line driver.

13. The apparatus of claim 9, further comprising third data lines, wherein the memory block includes a third partial block, the third partial block including third strings of memory cells of the plurality of strings of memory cells, the third strings of memory cells including third memory cells in the first tier of the plurality of tiers, the third memory cells mapped to a third partial page of the page, and the third data lines coupled to the third strings of memory cells.

14. The apparatus of claim 13, further comprising a control unit to activate the first data lines during a memory operation and disable the second data lines in the memory operation.

15. The apparatus of claim 14, wherein the control unit is configured to store a first portion of data in the first memory cells at a first time, and to store a second portion of the data in the second memory cells at a second time after the first time.

16. A method comprising:
receiving first data;
storing the first data in a first partial page of a memory device; and
receiving second data;
storing the second data in a second partial page of the page after the first data is stored in the first partial page, the memory device including:
a plurality of strings of memory cells, the memory cells formed in a plurality of tiers, the strings of memory cells arrange in memory blocks, wherein a memory block among the memory block includes a first partial block and a second partial block, the first partial block including first strings of memory cells of the plurality of strings of memory cells, the first strings of memory cells including first memory cells in a first tier of the plurality of tiers, the second partial block including second strings of memory cells of the plurality of strings of memory cells, the second strings of memory cells including second memory cells in the first tier of the plurality of tiers;
first data lines coupled to the first strings of memory cells, the first partial page mapped to the first memory cells; and
second data lines coupled to the second strings o memory cells, second data lines being different from the first data lines, the second partial page mapped to the second memory cells.

17. The method of claim 16, further comprising:
initiating the storing of the first data in the first partial page before a page buffer associated with the memory block is filled.

18. The method of claim 16, wherein storing the second data is performed without erasing the memory block after the first data is stored and before the second data is stored.

19. The method of claim 16, wherein the first data and the second data are concurrently received.

20. The method of claim 16, wherein the first data and the second data are received at different times.

* * * * *